United States Patent [19]

Bilsback

[11] 4,018,496
[45] Apr. 19, 1977

[54] INTERCONNECTION FOR CONDUCTOR ASSEMBLIES HAVING CLOSELY SPACED CONDUCTIVE LINES

[75] Inventor: Malvin S. Bilsback, Woodstock, N.Y.

[73] Assignee: IBM Corporation, Armonk, N.Y.

[22] Filed: Jan. 12, 1976

[21] Appl. No.: 648,450

Related U.S. Application Data

[63] Continuation of Ser. No. 482,825, June 24, 1974, abandoned.

[52] U.S. Cl. .............................................. 339/17 F
[51] Int. Cl.² ......................................... H05K 1/08
[58] Field of Search ........... 339/17 R, 17 E, 17 CF, 339/17 F, 17 LM, 17 M, 17 T, 75 MP, 176 MF, 176 MP; 174/68.5, 88 R, 52 FP

[56] References Cited

UNITED STATES PATENTS

| | | | |
|---|---|---|---|
| 2,898,522 | 8/1959 | Handen | 339/17 N X |
| 3,059,211 | 10/1962 | Thomas et al. | 339/176 MF |
| 3,307,139 | 2/1967 | Prise | 339/176 MF |
| 3,336,434 | 8/1967 | Crimmins | 174/88 R X |
| 3,629,787 | 12/1971 | Wilson | 339/176 MF X |
| 3,746,932 | 7/1973 | Hogan et al. | 174/52 FP X |

FOREIGN PATENTS OR APPLICATIONS

| | | | |
|---|---|---|---|
| 932,791 | 7/1963 | United Kingdom | 174/68.5 |
| 940,518 | 10/1963 | United Kingdom | 339/17 F |

Primary Examiner—Roy Lake
Assistant Examiner—Mark S. Bicks
Attorney, Agent, or Firm—W. S. Robertson

[57] ABSTRACT

A set of closely spaced, parallel conductive lines on an insulating support are located in face to face electrical contact with a corresponding set of conductive lines on a second insulating support, and a new structure is provided for adjusting the two sets of lines to match properly despite variations in the spacing between the lines of a set. The first set of lines has close, even, spacing. In the second set, the lines converge slightly from a spacing that is wider than the spacing of the first set to a spacing that is narrower than the spacing of the first set. During assembly, the position where contact occurs between the two sets is adjusted so that satisfactory electrical contact is made between each pair of lines.

5 Claims, 6 Drawing Figures

INTERCONNECTION FOR CONDUCTOR ASSEMBLIES HAVING CLOSELY SPACED CONDUCTIVE LINES

This is a continuation of application Ser. No. 482,825 filed June 24, 1974, now abandoned.

INTRODUCTION

Several electrical devices have first and second insulating supports that each carry parallelly extending conductive lines that are to be joined in face to face contact by securing the two insulating supports together. This invention is particularly intended for a gas panel, which has very difficult requirements for such a connection. In a gas panel, two glass plates each have a set of parallel extending conductive lines and the plates are arranged with their lines extending at right angles in closely parallel planes to form an array of light emitting cells at each point where a line of one set crosses a line of the other set. When suitable voltages are applied between two crossing conductors, light is emitted from the cell. These conductors extend beyond the viewing region formed by the cross-overs to the edge of the glass plate where they are individually connected to the circuits that select a line for a display operation. Since a viewer sees an image as a set of illuminated points in the array formed by the crossovers, the resolution of the display is improved by decreasing the spacing between lines. By the known techniques of photolithography, lines can be formed with a spacing that is much closer than the spacing to which the second electrical conductor can easily make contact. One problem occurs because the dimensions of the second conductor assembly may change so that the lines of the second set cannot be positioned to contact the lines of the first set. A specific object of this invention is to provide an improved connection between the lines at the edge of a gas panel plate and a conductor assembly that has similarly spaced lines formed on a flexible insulating support.

SUMMARY OF THE INVENTION

According to this invention, conductive lines are formed on two supports in a pattern that causes the lines of the second set to skew across the lines of the first set so that contact is made at some point along the length of the lines of the first set regardless of the normal variations in the spacing between the lines. In the preferred embodiment of the invention, the lines of the first set have close spacing and extend generally parallel, as is conventional in a gas panel and many other electrical devices; the lines of the second set converge from a spacing that is wider than the spacing between lines of the first set to a spacing that is less than the spacing between lines of the first set. The combination of such a set of lines and its support will be called a "conductor assembly". Insulation is located between the two conductor assemblies. During the manufacturing operation of interconnecting the first and second conductor assemblies, the two conductor assemblies and the insulation are relatively positioned to establish electrical contact between lines of the two sets at a selected crossing point. The two assemblies and the insulation are then clamped or otherwise held in position.

THE DRAWING

THE CONNECTOR OF THE DRAWING

Figure 1:
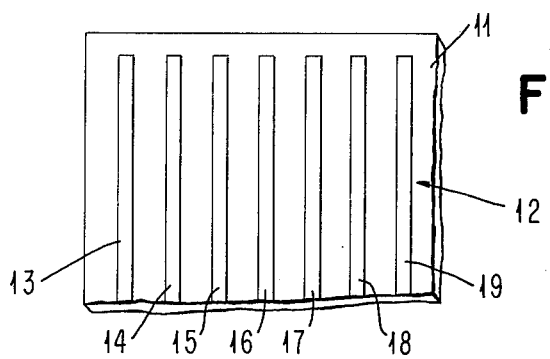
FIG. 1 shows a portion of a first conductor assembly.

FIG. 1 shows a portion of a glass plate 11 of a gas panel. A set 12 of lines 13 through 19 of a conductive material such as copper are formed by conventional techniques on plate 12 in a generally parallel array. The width of the lines and the spacing between the lines depends on the particular application for the lines, and the drawing is not to any particular scale. The lines that are formed on the glass plate of a gas panel are highly accurate and the spacing between the lines does not vary significantly from the ideal situation that the drawing represents. In the more general case, however, the width of the lines and the spacing between the lines depends on the accuracy with which these lines can be formed and maintained. A wide variety of devices use the construction of FIG. 1, and from a more general standpoint, FIG. 1 shows a first set of generally parallel conductive lines 12 formed on a surface of a first support 11. For some applications for this invention, support 11 may be flexible.

Figure 2:
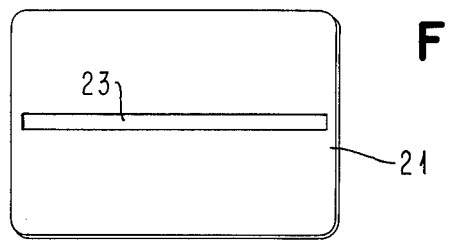
FIG. 2 shows a thin layer of insulation.
Figure 3:
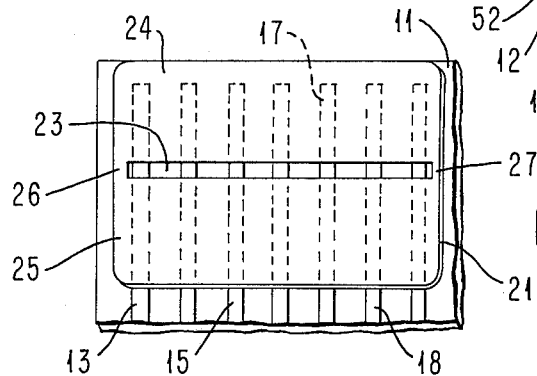
FIG. 3 shows the insulation of FIG. 2 assembled with the conductor assembly of FIG. 1.

FIG. 2 shows a layer of insulation 21 for the structure of FIG. 1 with a window 23 for exposing a selected region of each conductive line 12. FIG. 3 shows insulation layer 21 of FIG. 2 located on the conductor assembly of FIG. 1. Layer 21 may be a thin material such as glass deposited on the structure of FIG. 1 and etched to form the windows. Alternatively, layer 21 may be formed as a discrete insulating component and then applied to the structure of FIG. 1 by suitable means such as an adhesive. (Some gas panels have a layer of glass covering lines 12 and adjacent portions of plate 11; this layer may be etched to form window 23 or, as the drawing represents, a larger area is etched and is later insulated and sealed by layer 21.) Thus, insulation layer 21 and window 23 may be located at a predetermined place on the first conductor assembly without regard to the relationship of a second conductor assembly or it may be located at an individually selected position during final assembly. A variety of techniques are well known for forming an insulating layer in the shape shown in FIG. 2.

Insulating layer 21 has a region 24 that extends from the window outward over the free ends of lines 12, a region 25 that covers the region of lines 12 just before the window, and regions 26, 27 that connect these two regions across the ends of the window. Regions 26 and 27 cooperate with the other regions to form a seal to prevent contamination of line 12. Regions 26 and 27 are spaced from adjacent conductors 13 and 19 sufficiently to be flat on plate 11 and to allow for variations in the distance between these outermost lines. Region 24 additionally permits a selected length of line 12 to extend beyond the window. Thus applications that do not require these advantages may use only the region 25 or two separate regions 24 and 25.

Figure 4:
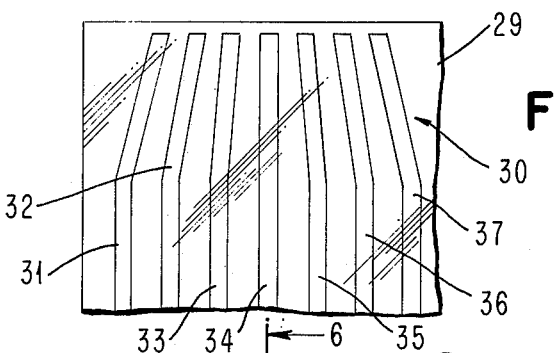
FIG. 4 shows a second conductor assembly.

FIG. 4 shows a second insulating support 29 with a set 30 of lines 31 through 37 of conductive material such as copper. In the assembled apparatus, each line of set 30 makes electrical contact with a corresponding line of set 12. Insulating support 29 is preferably a thin, flexible, plastic material to provide a mechanically flexible connection between the components of glass plate 11 of a gas panel and other components that are mounted independently of plate 11. It is a characteristic of such materials that the lines cannot be formed and maintained as accurately as the lines on glass plate 12. As the components are shown in the drawing, each line of set 30 is formed on the underside of support 29 and support 29 is transparent or semi-transparent (as is common), so that an assembler can see the lines distinctly through insulator 29, as FIG. 4 represents. Except for the shape of the insulating layer 21 and the conductive lines 30 in FIG. 4, the components of FIGS. 1-4 are conventional and illustrate a variety of conductors with which this invention will be useful. The shape of lines 21 in FIG. 4 will be explained next.

Figure 5:
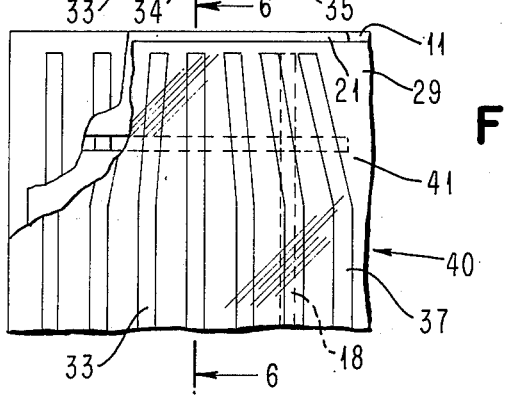
FIG. 5 shows an assembly of the components of the preceding figures with parts cut away to better show the sequence of components.

FIG. 5 shows the conductor assembly of FIG. 4 mounted on the conductor assembly and insulation structure of FIG. 3 with parts broken away to better show the relationship of the layers. Conductive line 34 is in the same unbent configuration as the conventional lines of FIG. 1, and the assembly of the components of FIGS. 3 and 4 to form the structure of FIG. 5 may be begun by aligning conductor 34 with corresponding conductor 16 of FIG. 3. The structure of FIG. 4 can then be further adjusted by moving conductive line 34 vertically along conductive line 16 of gas panel plate 11.

In a conventional structure of this type, lines 30 would be made as accurately as possible in the same configuration as lines 12 in FIG. 1, adjacent lines having nearly equal spacing along their length. In assembling such a conventional structure it would often occur that the spacing of the second set is in fact closer or wider than the spacing of the first set so that a satisfactory connection could not be made all along the width of the conductor assemblies. In the conductor assembly of FIGS. 4 and 5, the lines 30 have a region 40 where they are generally parallel with a spacing that is greater than the spacing of the lines 12 in the case of worst shrinkage or least expansion. In a region 41, lines 30 converge to a spacing that is less than the spacing of lines 12 in the case of least shrinkage or worst expansion of support 29. Thus, at some position in region 41 there is a horizontal line across lines 30 where the spacing equals the spacing of lines 12. In the assembly method in which layer 21 is located on plate 11 at a position that is independent of the second conductor assembly, the conductor assembly of FIG. 5 is adjusted in position until lines 30 cross the corresponding lines 12 at window 23; the structure of FIG. 5 is then secured in position. Alternatively, the two conductor assemblies are aligned both laterally and vertically and insulation layer 21 is adjusted to the position where lines 12 and 30 meet at the window. Window 23 and a representative line of set 12 are shown by dashes to illustrate this alignment; in an actual structure, portions of lines 12 would be visible through support 29 and window 23 for the alignment step of assembly. Alternatively, the structure can be tested for proper electrical contact between each pair of conductors. FIG. 5 shows a few lines converging about a central unbent line 34. A typical application for this invention has a large number of lines which can be arranged about a single central unbent line, all to one side of an unbent line, or other equivalent configurations. Similarly, patterns of this type can be repeated in structures having more lines.

Figure 6:
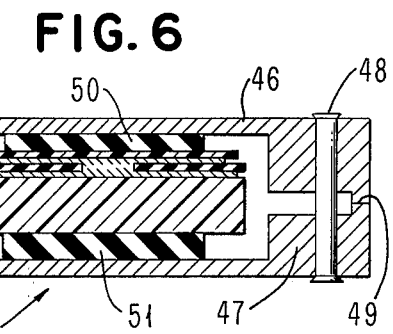
FIG. 6 is an edge view of the assembly of FIG. 5 and the preferred clamp along line 6—6 of FIG. 5.

In FIG. 6, a clamp 45 has two complementary parts 46 and 47 that are interconnected by a rivet 48 and pivot along a line 49 to apply a predetermined clamping force to the structure of FIG. 5 through pads 50, 51 which are of a suitable resilient material such as rubber. Additional insulation 52 for the second conductor assembly is shown.

From this description of the preferred embodiment of the invention, those skilled in the art will recognize suitable modifications to apply the invention to a variety of well known connector assemblies within the scope of the claims.

What is claimed is:
1. An electrical structure comprising:
 a first conductor assembly having a first insulating support of a generally rigid material such as glass and a first set of conductive lines on a surface of said first support, said lines extending generally parallel and having a predetermined spacing that does not vary significantly;
 a second conductor assembly having a second insulating support and a second set of conductive lines on a surface of said support, said second insulating support being of a thin, flexible, plastic material such that said conductive lines of said second set are formed and maintained less accurately than the conductive lines of said first set, said lines in a first region of said second set having a spacing that varies progressively from a spacing that is greater than said predetermined spacing of said first set to a spacing that is less than said predetermined spacing of said first set, whereby said predetermined spacing of said first set exists along a line in said first region of said second set regardless of variations in the spacing between lines of said first and second sets within predetermined tolerances;
 a thin insulation layer covering the regions of said first conductive lines closely adjacent to said line in the region where said spacing of said first lines is less than the spacing of said second lines, and;
 means including resilient pads connecting said first and second conductor assemblies to make electrical contact along said line.

2. The electrical structure of claim 1 wherein said layer of insulation has a window exposing said conductive lines along said line of contact.

3. The electrical structure of claim 2 wherein said insulation layer comprises a layer of glass formed on said first conductor assembly for sealing said conductors from contaminants.

4. The electrical structure of claim 2 wherein said insulation layer comprises a discrete insulation layer and adhesive means affixing said insulation layer to said first conductor assembly.

5. The electrical structure of claim 2 wherein said lines of said second set converge from a region of generally parallel wider spacing to skew across the conductor of said first set.

* * * * *